(12) United States Patent
Ahn et al.

(10) Patent No.: US 6,420,742 B1
(45) Date of Patent: Jul. 16, 2002

(54) FERROELECTRIC MEMORY TRANSISTOR WITH HIGH-K GATE INSULATOR AND METHOD OF FABRICATION

(75) Inventors: Kie Y. Ahn, Chappaqua, NY (US); Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 48 days.

(21) Appl. No.: 09/594,817

(22) Filed: Jun. 16, 2000

(51) Int. Cl.[7] ............................................... H01L 29/76
(52) U.S. Cl. ............................ 257/295; 257/288; 438/3; 438/197
(58) Field of Search ................................ 257/288, 295; 438/3, 197

(56) References Cited

U.S. PATENT DOCUMENTS

| | | | |
|---|---|---|---|
| 5,079,606 A | 1/1992 | Yamamura et al. ......... 257/365 |
| 5,248,564 A | * 9/1993 | Ramesh ..................... 428/688 |
| 5,559,733 A | * 9/1996 | McMillan et al. .......... 365/145 |
| 5,572,052 A | * 11/1996 | Kashihara et al. .......... 257/295 |
| 5,621,681 A | * 4/1997 | Moon ......................... 365/145 |
| 5,638,319 A | 6/1997 | Onishi et al. ............... 365/145 |
| 5,666,305 A | * 9/1997 | Mihara et al. .............. 365/145 |
| 5,834,803 A | * 11/1998 | Nashimoto et al. ......... 257/295 |
| 5,850,231 A | * 12/1998 | Orimoto et al. ............. 345/507 |
| 5,852,703 A | * 12/1998 | Nashimoto et al. ......... 385/130 |
| 6,010,927 A | 1/2000 | Jones, Jr. et al. ............ 438/210 |
| 6,034,387 A | 3/2000 | Koo ............................ 257/295 |
| 6,063,698 A | * 5/2000 | Tseng et al. ................ 438/585 |
| 6,339,238 B1 | * 1/2002 | Lim et al. .................... 257/295 |

FOREIGN PATENT DOCUMENTS

JP            05110158 A    *  4/1993    ......... H01L/41/187

OTHER PUBLICATIONS

Kohji Matsuo, et al., "Reliable High–k TiO$_2$ Gate Insulator Formed by Ultrathin TiN Deposition and Low Temperature Oxidation", Extended Abstracts of the 1999 International Conference on Solid State Devices and Materials, Tokyo, 1999, pp. 164–165.

* cited by examiner

Primary Examiner—Nathan Flynn
Assistant Examiner—Scott R Wilson
(74) Attorney, Agent, or Firm—Dickstein Shapiro Morin & Oshinsky LLP

(57) ABSTRACT

A ferroelectric memory transistor comprising a thin high-dielectric constant gate insulator, such as titanium oxide (TiO$_2$), coupled with an insulating film of a weak ferroelectric material, as well as a method for its formation are disclosed. The weak ferroelectric film may contain a zinc oxide material doped with lithium and/or magnesium.

66 Claims, 7 Drawing Sheets

FERROELECTRIC MEMORY TRANSISTOR WITH HIGH-K GATE INSULATOR AND METHOD OF FABRICATION

FIELD OF THE INVENTION

The present invention relates generally to semiconductor circuits and, in particular, to semiconductor ferroelectric memory devices and their method of manufacture.

BACKGROUND OF THE INVENTION

Ferroelectric memory cells that use ferroelectric memory films as gate insulators are increasingly used for high volume memory production. Recent advances in thin-film technology have produced nonvolatile ferroelectric memory devices which can perform high-speed read/write operations by using the polarization reversal and retention characteristics of the ferroelectric films.

Currently, there are two types of conventional ferroelectric memory devices: one which uses a transistor to detect the amount of charge stored in a capacitor, and one which detects a change in the resistance of a transistor caused by the spontaneous polarization of a ferroelectric material. The second type of conventional ferroelectric memory device typically has a single transistor, and no capacitor.

An example of the second type of ferroelectric memory device is a ferroelectric insulator semiconductor field-effect transistor (FET), which employs a ferroelectric film instead of the conventional gate insulating film, and in which the read-out operation is performed by forming an inversion layer in a channel region of the transistor. The inversion layer is formed by controlling the potential on a silicon interface based on the polarization retention of the ferroelectric film. This type of ferroelectric memory device provides a nondestructive read-out and, thus, increases the efficiency of read/write operations.

An example of a field-effect transistor 20 using a ferroelectric film for storing information is schematically illustrated in FIGS. 1–2. A ferroelectric film 15, such as PZT (lead (Pb) zirconate titanite) or BaTiO$_2$(barium titanite), is formed as a gate insulating film on a p-type silicon substrate 10 (FIG. 1). Source and drain regions 12 having a high concentration of n-type impurity ions are also formed on the p-type silicon substrate 10 by well-known methods. A gate electrode 16 (FIG. 1) is formed over the ferroelectric film 15.

When a positive write voltage (Vp) is applied to the gate electrode 16, polarization of the ferroelectric film 15 occurs, as illustrated in FIG. 1. That is, because of the charge displacement in the ferroelectric film 15, electrons (minority carriers) are attracted to the surface of the p-type silicon substrate 10, to form a channel 13 (FIG. 1). Consequently, a conduction state occurs between the source and drain regions 12. The polarization in the ferroelectric film 15 remains even after the write voltage (Vp) is removed. Accordingly, the conduction state formed by the channel 13 is also maintained after the write voltage Vp is removed.

In contrast, when a negative erase voltage (Vn) is applied to the gate electrode 16 (FIG. 2), polarization opposite to that occurring for a positive write voltage (Vp) is brought about in the ferroelectric film 15. In this case, the charge displacement in the ferroelectric film 15 is reversed and the channel 13 of FIG. 1 disappears. Thus, a non-conduction state takes place between the source and drain regions 12, which is maintained even after the negative erase voltage (Vn) is removed.

The field-effect transistor 20 of FIGS. 1–2 which uses a ferroelectric material as the conventional gate insulating film may be used for storing information. As illustrated in FIGS. 1–2, both the write state (FIG. 1) and the erase state (FIG. 2) depend on the presence and absence, respectively, of the channel 13. Since a transistor could be in either a conductive or non-conductive state, depending on the presence or absence of the channel 13, any stored information can be read out by examining whether the transistor is conductive or non-conductive. Thus, information is stored in the ferroelectric film in the form of film polarization. Further, since the polarization of the ferroelectric film does not disappear even when the electric field is removed, the memory of the semiconductor device is nonvolatile.

Although ferroelectric memory transistors, such as the field-effect transistor 20 of FIGS. 1–2, are promising memory devices, there are still some drawbacks with the use of a ferroelectric film as a gate insulating layer.

One major drawback stems from the fact that a conventional ferroelectric memory device requires the deposition of the ferroelectric film directly on a semiconductor layer, such as silicon (Si) or gallium arsenide (GaAs). When a ferroelectric film, such as the ferroelectric film 15 (FIGS. 1–2), formed typically of PZT or BaTiO$_3$, is deposited directly on the silicon substrate 10, metals such as Pb (from PZT) or Ba (from BaTiO$_3$) diffuse into the surface of the silicon substrate 10. In addition, oxygen from the oxygen-rich ferroelectric film 15 may also diffuse at the silicon-ferroelectric interface, forming a superfluous thin film, for example, of SiO$_2$. Thus, electric charges may be trapped at the silicon-ferroelectric interface by defects that are created by the metal and/or oxygen diffusion. When such trapping of electric charges occurs, the operation of the ferroelectric field-effect transistor 20 becomes unstable, the charge produced by the polarization retention may be erased, and the overall characteristics of the semiconductor device may be altered.

Further, the deposition of the ferroelectric film 15 (FIGS. 1–2) on the silicon substrate 10 typically requires deposition temperatures higher than 500° C. The high-temperature treatments tend to further facilitate the diffusion of the ferroelectric constituents at the silicon-ferroelectric interface.

Accordingly, since a ferroelectric film is not compatible with a silicon substrate in terms of thermal expansion coefficient and lattice structure, it is very difficult to form a high-quality ferroelectric film on the silicon substrate. This difficulty is augmented by the fact that the formation of the source and drain regions typically requires temperatures of approximately 1000° C., and the conventional ferroelectric films are not capable of sustaining such high temperatures.

Various efforts have been attempted by the semiconductor industry to address the drawbacks posed by placing ferroelectric films on a substrate. For example, more recent memory devices separate the ferroelectric film from the silicon substrate by using a gate oxide layer 11 (FIG. 3), for example a SiO$_2$ layer, formed between the silicon substrate 10 and the ferroelectric film 15. Further, a bottom programming conductor layer 13 and a top conductor layer 17 are formed below and above the ferroelectric film 15 to form a stacked gate structure 21, as shown in FIG. 3. Such gate structures overcome the problems posed by the silicon-ferroelectric interface explained above. Unfortunately, the bottom programming conductor 13, which is interposed between the gate oxide layer 11 and the ferroelectric film 15 which is used to program the device without exceeding the breakdown voltage of the gate insulator, creates a conductive path through the transistor that is unnecessary for its operation.

Another drawback of such ferroelectric memory device is the difference in the permittivity of the ferroelectric film and that of the adjacent layers. If the stacked gate structure 21 of FIG. 3 is viewed as a series of stacked capacitors 60 (FIG. 4), which has layers of thicknesses comparable to those of the stacked gate structure 21, then, a first capacitor $C_1$ (FIG. 4) corresponds to the ferroelectric film 15 (FIG. 3) and a second capacitor $C_2$ (FIG. 4) corresponds to the gate oxide layer 11 (FIG. 3). Since typical ferroelectrics have an effective electric permittivity in a range of about 400 to about 2500, while the electric permittivity of silicon oxide is only of about 4, the capacitance of the first capacitor $C_1$ is much larger than the capacitance of the second capacitor $C_2$. Thus, voltage $V_1$ which occurs across the first capacitor $C_1$ is much smaller than voltage $V_2$ which occurs across the second capacitor $C_2$. As a result, the applied voltage V that occurs across the series of capacitors 60, that is the sum of $V_1$ and $V_2$, would appear almost totally across the gate oxide layer 11, rather than across the ferroelectric film 15.

Accordingly, there is a need for an improved ferroelectric memory transistor which eliminates the problems posed by the diffusion of metal and/or oxygen of the ferroelectric film at the silicon-ferroelectric interface, and which eliminates the need for a programming conductor interposed between the ferroelectric film and the gate oxide layer. A ferroelectric memory transistor with minimal voltage drop across the ferroelectric film is also desirable, as is as a method for forming such a ferroelectric memory transistor.

SUMMARY OF THE INVENTION

The present invention provides a ferroelectric memory transistor and a method of forming it. The transistor uses a high-dielectric constant gate insulator, such as titanium oxide ($TiO_2$), coupled with a weak ferroelectric insulating film formed over the thin high-dielectric gate insulator. The weak ferroelectric film may contain a zinc oxide material doped with lithium and/or magnesium. The ferroelectric memory transistor of the invention suppresses undesirable diffusion of metal and/or oxygen at the silicon-ferroelectric interface, reduces voltage drop across the ferroelectric film, and permits effective transistor operations without the need of a programming conductor.

These and other advantages and features of the invention will be more clearly understood from the following detailed description which is provided in connection with the accompanying drawings.

DETAILED DESCRIPTION OF THE PREFERRED EMBODIMENTS

In the following detailed description, reference is made to various specific embodiments in which the invention may be practiced. These embodiments are described with sufficient detail to enable those skilled in the art to practice the invention, and it is to be understood that other embodiments may be employed, and that various structural, logical, and electrical changes may be made without departing from the spirit or scope of the invention.

The term "substrate" or "wafer" used in the following description may include any semiconductor-based structure that has an exposed silicon surface. Structure must be understood to include silicon-on insulator (SOI), silicon-on sapphire (SOS), doped and undoped semiconductors, epitaxial layers of silicon supported by a base semiconductor foundation, and other semiconductor structures. When reference is made to a substrate or wafer in the following description, previous process steps may have been utilized to form regions or junctions in or over the base semiconductor or foundation.

The term "metal" is intended to include not only elemental metal, but metal with other trace metals or in various alloyed combinations with other metals as known in the semiconductor industry, as long as such alloy is conductive. Similarly, the term "ferroelectric material" is intended to include not only elemental ferroelectric material, but ferroelectric material with other trace elements or trace metals, or in various alloyed combinations with other ferroelectric materials known in the semiconductor industry, as long as the physical and electrical properties of the ferroelectric material remain unchanged.

The present invention provides an improved ferroelectric memory transistor comprising a high-dielectric constant gate insulator, such as titanium oxide (TiO$_2$), coupled with a thicker weak ferroelectric insulating film formed over the high-dielectric constant gate insulator. The ferroelectric memory transistor of the invention suppresses the undesirable diffusion of metal and/or oxygen at the silicon-ferroelectric interface, reduces the voltage drop across the ferroelectric film, and permits effective transistor operations without the need of a programming conductor.

Figure 1:
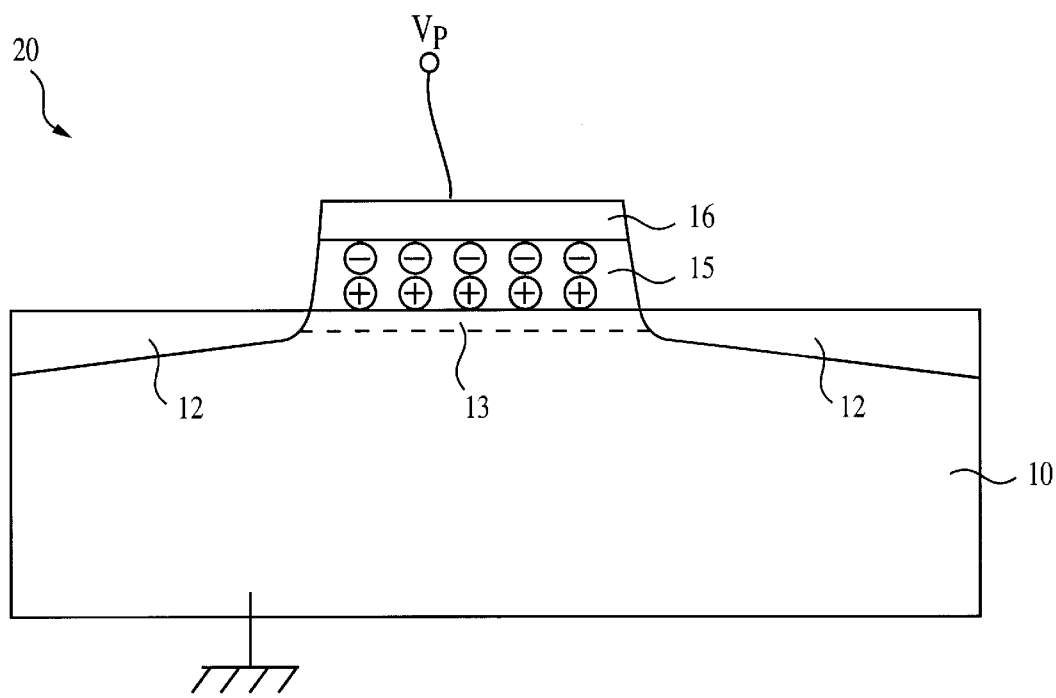
FIG. 1 is a schematic cross-sectional view of a portion of a conventional ferroelectric memory device formed in accordance with a method of the prior art and under a positive write voltage.
Figure 2:
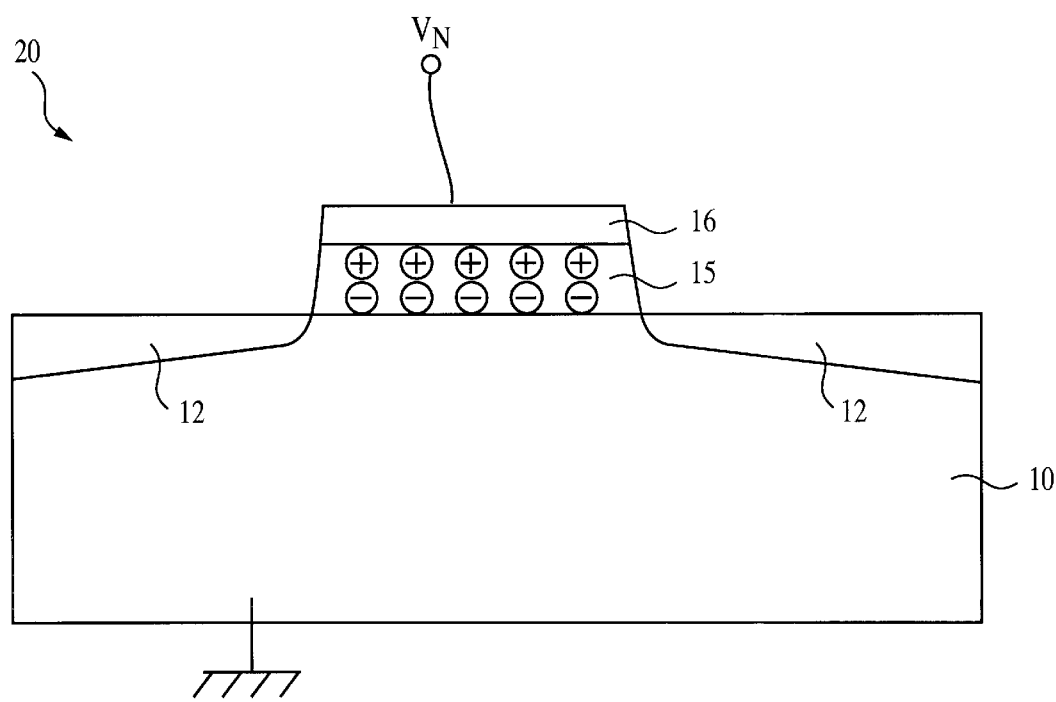
FIG. 2 is a schematic cross-sectional view of a portion of a conventional ferroelectric memory device formed in accordance with a method of the prior art and under a negative erase voltage.
Figure 3:
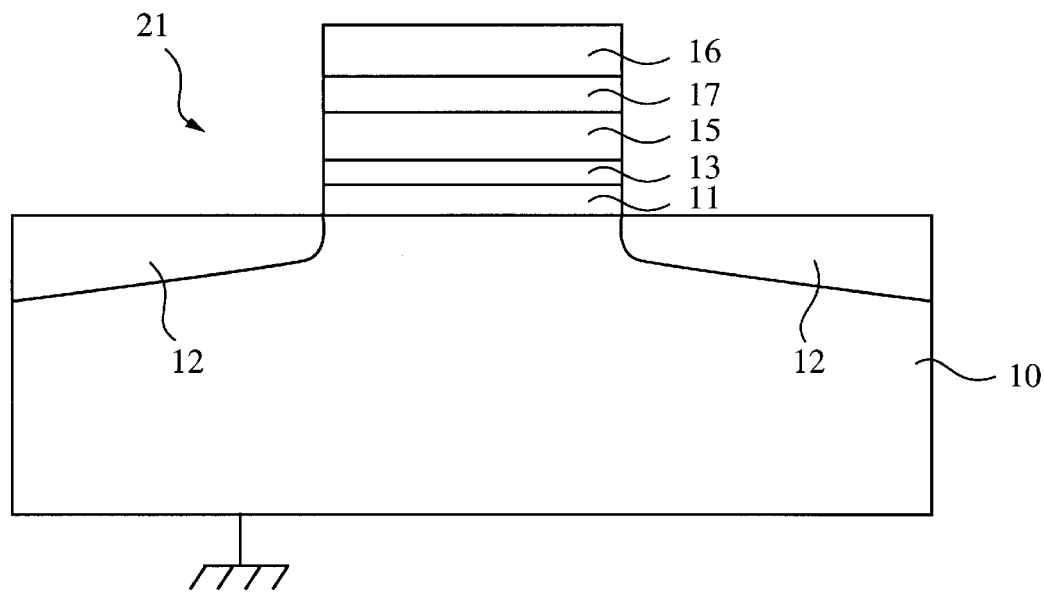
FIG. 3 is a schematic cross-sectional view of a portion of a conventional ferroelectric memory device formed in accordance with the prior art and including a programming conductor.
Figure 5:
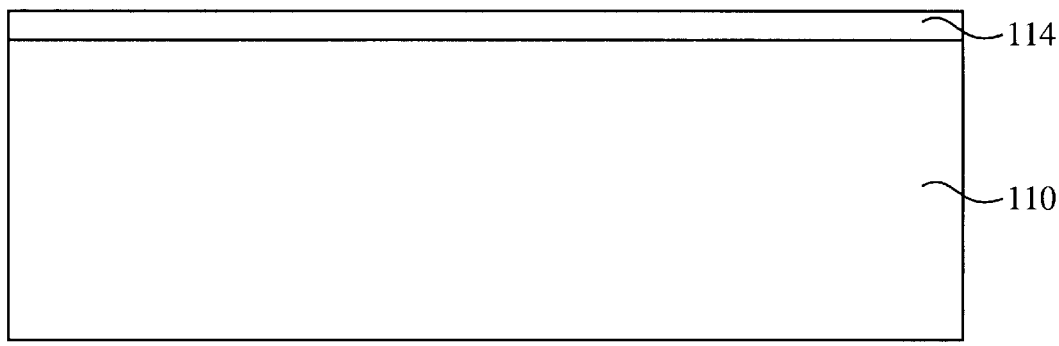
FIG. 5 is a schematic cross-sectional view of a portion of a ferroelectric memory device formed according to an exemplary embodiment and method of the present invention.

Referring now to the drawings, where like elements are designated by like reference numerals, FIGS. 5–14 illustrate the formation of one embodiment of an improved ferroelectric memory transistor 200 (FIG. 14) of the present invention. As shown in FIG. 5, a gate insulating layer 114 is formed on a silicon substrate 110. The silicon substrate 110 in this application will be referred to as a p-type silicon substrate 110. However, an n-type silicon substrate may be also used. Further, it must be understood that the substrate need not be silicon-based. Thus, the present invention has equal applicability to other semiconductor substrates, such as, for example, silicon-germanium, germanium, silicon-on-saphire, or gallium-arsenide substrates, among others.

The gate insulating layer 114 may be formed of a silicon oxide material, for example, a thermally-grown silicon dioxide (SiO$_2$) to a thickness of approximately 25 Angstroms. However, other insulating materials, such as silicon nitrides, silicon oxynitrides, or carbides, may be used also, in accordance with the processing requirements and the characteristics of the IC devices to be formed at subsequent steps.

Once the formation of the thin gate insulating layer 114 (FIG. 5) is completed, an ultra thin layer of high-dielectric constant insulating material 117 (FIG. 7), for example of titanium oxide (TiO$_2$), is formed over the gate insulating layer 114. A high-dielectric constant material is a material with a dielectric constant of about 10–100. Since the dielectric constant (k) of TiO$_2$ is very high, of about 80, titanium oxide (TiO$_2$) is the preferred material. However, it must be understood that the present invention is not limited to the use of titanium oxide (TiO$_2$) as a high-dielectric constant insulating material, and other high-dielectric constant materials can also be used. Thus, materials such as barium oxide (BaO) (k of about 31–37), tantalum oxide (Ta$_2$O$_5$) (k of about 20–25), ytterbium oxide (Yb$_2$O$_3$) (k of about 11.8–12.6), ruthenium oxide (Ru$_2$O$_3$) (k of about 12.5–12.9), or cerium oxide (CeO$_2$) (k of about 16.2–26), among others, may be used also.

The titanium oxide (TiO$_2$) layer 117 (FIG. 7) may be formed by one of at least two different methods, (1) oxidation of titanium nitrite (TiN) or (2) jet vapor deposition (JVD) of TiO$_2$, as will be described in more detail below.

Figure 6:
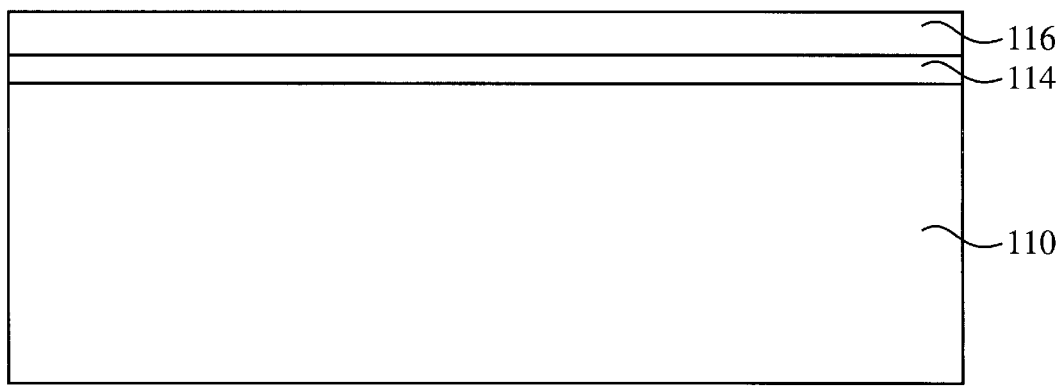
FIG. 6 is a schematic cross-sectional view of the ferroelectric memory device of FIG. 5 at a stage of processing subsequent to that shown in FIG. 5.
Figure 4:
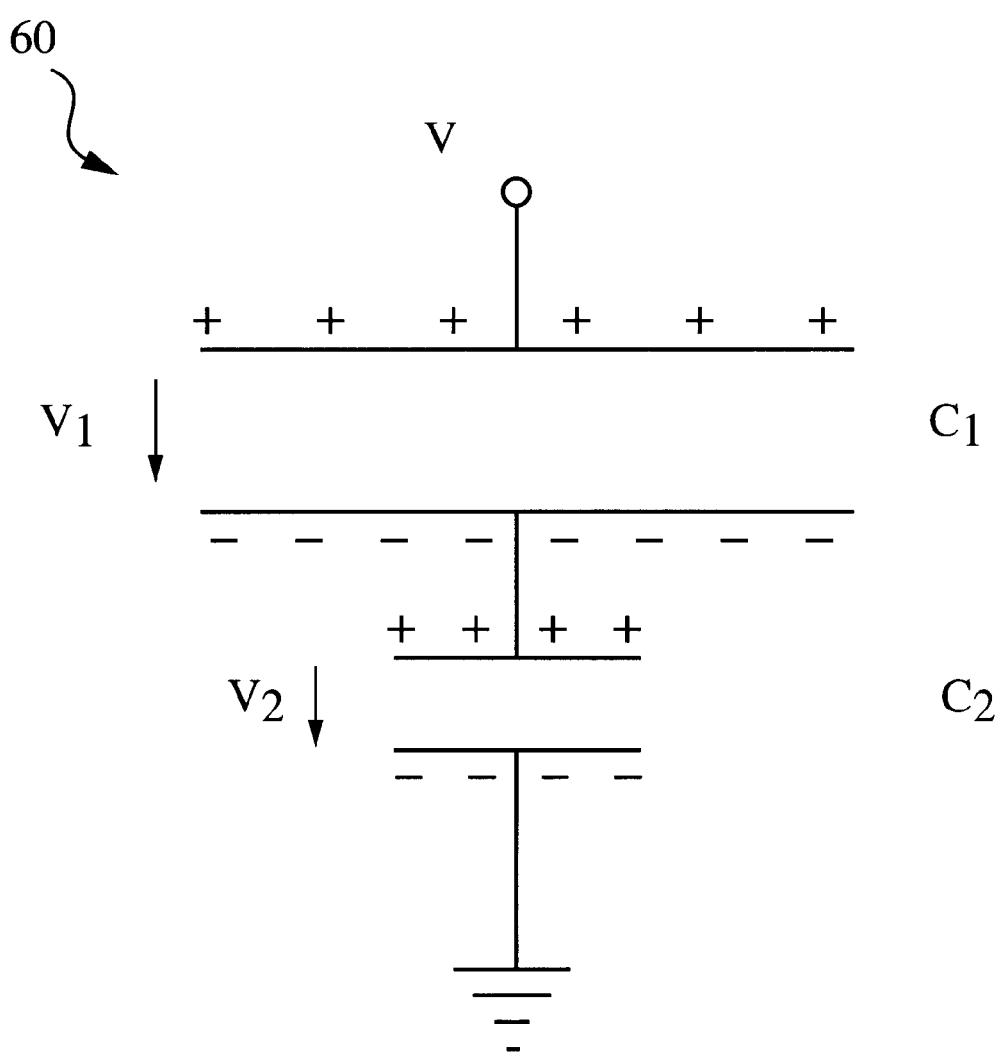
FIG. 4 is a schematic view of a series of capacitors corresponding to stacked layers of the ferroelectric memory device of FIG. 3.
Figure 7:
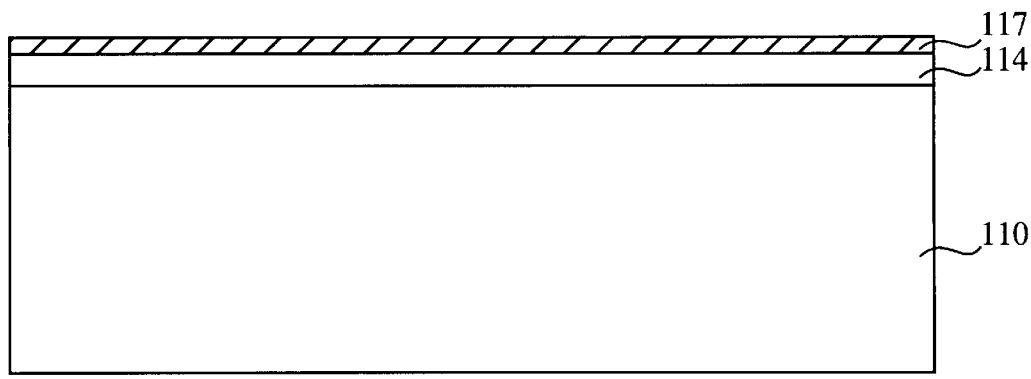
FIG. 7 is a schematic cross-sectional view of the ferroelectric memory device of FIG. 5 at a stage of processing subsequent to that shown in FIG. 6.

In an exemplary embodiment of the invention and as illustrated in FIG. 6, an ultra thin layer 116 of titanium nitride (TiN), with a thickness less than 100 Angstroms, is first formed over the gate insulating layer 114. The ultra thin TiN layer 116 is further oxidized at low temperatures to form an ultra thin titanium oxide (TiO$_2$) layer 117, as shown in FIG. 7. Precise details of the TiN oxidation technique can be employed were given recently by Matsuo et al., in *Reliable High-k TiO$_2$ Gate Insulator Formed by Ultrathin TiN Deposition and Low Temperature Oxidation*, Extended Abstracts of the 1999 Int'l Conference on Solid State Devices and Materials, Tokyo, 164–65 (1999), the disclosure of which is incorporated by reference herein. However, a brief summary of how the ultra thin titanium oxide (TiO$_2$) layer 117 (FIG. 7) is formed is believed to be helpful to the understanding of the present invention.

The ultra thin TiN layer 116 (FIG. 6) is first deposited over the gate insulating layer 114 by reactive sputtering or chemical vapor deposition (CVD) to a thickness of about 30 to 100 Angstroms, preferably of about 60 Angstroms. Next, the ultra thin TiN layer 116 is oxidized at temperatures of about 300 to 800° C., and preferably at temperatures below 500° C., to form the ultra thin titanium oxide (TiO$_2$) layer 117 (FIG. 7) in dry oxygen. As Matsuo et al. have reported, the ultra thin TiN deposition coupled with the low temperature oxidation avoid undesirable silicon oxidation during TiO$_2$ formation. The TiO$_2$ formation by the above-mentioned method also improves the electrical characteristics of the semiconductor device because of the smoother surface of the microcrystalline structure of the TiO$_2$ film and the smoother TiO$_2$/SiO$_2$ interface, without reaction with the underlying SiO$_2$ film.

The ultra thin titanium oxide (TiO$_2$) layer 117 of FIG. 7, formed by the above-described oxidation method, has a thickness of about 10 to 100 Angstroms, preferably of about 20 to 30 Angstroms.

The titanium oxide layer (TiO$_2$) 117 formed by the above-described TiN conversion has an estimated dielectric constant much higher than the dielectric constant of titanium oxides formed by conventional methods. Since the titanium oxide (TiO$_2$) layer 117 is formed by oxidation at temperatures lower than 500° C. and by conversion of TiN, the titanium oxide in this case retains an amorphous or microcrystalline structure, and, as reported by Matsuo et al., its dielectric constant is approximately 80.

In accordance with yet another embodiment of the present invention, the titanium oxide (TiO$_2$) layer 117 (FIG. 7) is formed by jet vapor deposition (JVD), by flowing a jet of titanium vapors and a jet of atomic oxygen into a deposition chamber. The titanium vapor is generated by sputtering, at a relatively high pressure (1 Torr) in an argon (Ar) ambient in the upstream region of the vapor source. Argon flows through the vapor source at a rate of approximately 300–500 cc/min. The atomic oxygen could be generated by a microwave discharge.

The downstream pressure in the deposition chamber is of approximately 0.1 Torr, while the deposition temperature is of approximately 200–220° C. After an optional post-deposition anneal step at a temperature of approximately 600–750° C. in dry O$_2$, the titanium oxide (TiO$_2$) layer 117 (FIG. 7) is thus formed to a thickness of about 10 to 100 Angstroms, preferably of about 20 to 30 Angstroms.

Figure 8:
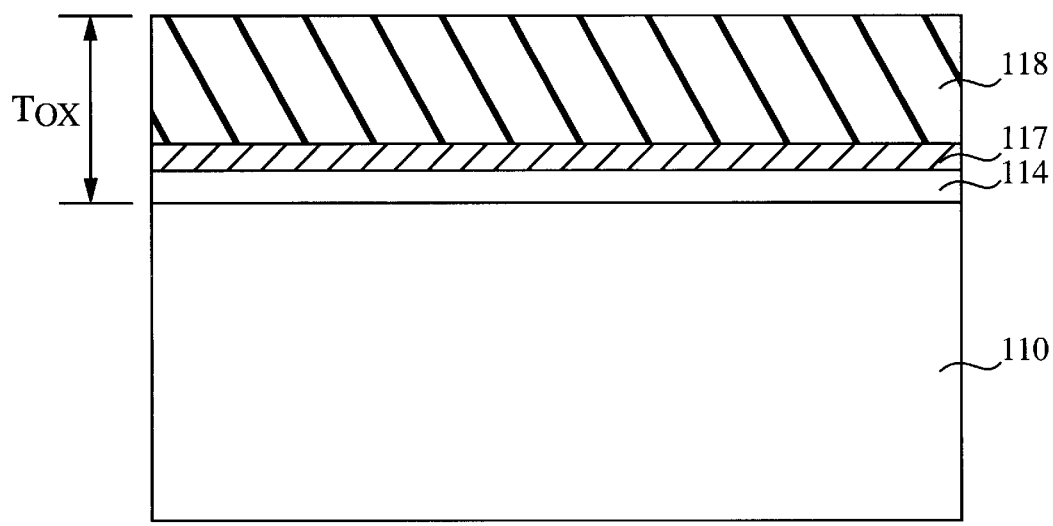
FIG. 8 is a schematic cross-sectional view of the ferroelectric memory device of FIG. 4 at a stage of processing subsequent to that shown in FIG. 7.

Reference is now made to FIG. 8. After the formation of the ultra thin titanium oxide (TiO$_2$) layer 117 by either one of the methods described above, a weak ferroelectric material layer 118 is next formed over the titanium oxide (TiO$_2$) layer 117. The weak ferroelectric material may be any ferroelectric material that exhibits weak ferroelectric properties, such as low spontaneous polarization. The weak ferroelectric material may be zinc oxide (ZnO), or zinc oxide (ZnO) doped with lithium (Li) and/or magnesium (Mg). Zinc oxide (ZnO) is an attractive material because of its unique weak ferroelectric properties. More specifically, zinc oxide (ZnO) is an n-type piezoelectric II–IV semiconductor characterized by wurtzite structure, high piezoelecticity, and enhanced electromechanical coupling properties. Although zinc oxide is stoichiometrically an insulator, it typically contains excess zinc atoms which affect its electrical conductivity.

Similarly, zinc oxide (ZnO) doped with lithium (Li) and/or magnesium (Mg) exhibits weak ferroelectric properties. For example, doped zinc oxide is generally characterized by a spontaneous polarization of about 0.01 $\mu$Coulomb/cm$^2$ to 1 $\mu$Coulomb/cm$^2$, which is much smaller than the larger values, in the order of 10 $\mu$Coulomb/cm$^2$, for ordinary ferroelectrics, for example, barium titanite (BaTiO$_3$). However, even with this small spontaneous polarization, the polarization of the weak ferroelectric layer 118 can alter the threshold voltage of the field effect transistor 200 (FIG. 14), thus producing distinctly different conductivity states through the field effect transistor at a given gate potential depending upon the polarization state The weak ferroelectric layer 118 (FIG. 8) is formed of a zinc oxide material doped with lithium (Li) and magnesium (Mg) at a level from about 1 mol% up to about 30 mol% of the metal component. As such, the doped zinc oxide material has a general formula of $Zn_x(Li_yMg_z)O$, where x ranges from about 0.70 to about 0.99, y and z each independently range from about 0.01 to about 0.30, and the sum of (y+z) ranges from about 0.01 to about 0.30. For the above general formula, it is not necessary that the oxide materials contain stoichiometric levels of oxygen, that is one atom of oxygen for each atom of metal. In fact, it is expected that there will be excess metal atoms in the oxide material. Thus, the proportions described above relate only to the metal component portion of the oxide materials.

The weak ferroelectric layer 118 (FIG. 8) having the general formula $Zn_x(Li_yMg_z)O$ may be formed over the ultra thin titanium oxide (TiO$_2$) layer 117 by various methods of the art. For example, the $Zn_x(Li_yMg_z)O$ ferroelectric material layer 118 may be formed by low pressure chemical vapor deposition (LPCVD) or physical vapor deposition (PVD) techniques, such as sputtering. Magnetron sputtering, such as RF-magnetron sputtering, using a zinc oxide target having the desired composition may be employed. Alternatively, a zinc oxide target with embedded strips or particles of lithium (Li) and magnesium (Mg) could also provide the desired sputtering composition. For sputtering, the primary sputtering gas may be an inert gas, for example argon (Ar), neon (Ne), xenon (Xe), or krypton (Kr), with or without oxygen (O$_2$).

In yet another embodiment of the present invention, the $Zn_x(Li_yMg_z)O$ ferroelectric layer 118 may be formed by jet vapor deposition (JVD) of zinc oxide (ZnO), lithium carbonate (Li$_2$CO$_3$), and magnesium oxide (MgO) in a vacuum. The desired composition of the doped zinc oxide material may be achieved by varying the ratios of lithium carbonate (Li$_2$CO$_3$) to magnesium oxide (MgO).

Regardless of the deposition technique used, the thickness of the $Zn_x(Li_yMg_z)O$ ferroelectric layer 118 (FIG. 8) is of about 500 to 5,000 Angstroms, more preferably of about 3,500 to 5,000 Angstroms.

Although the present invention has been described with reference to the weak ferroelectric layer 118 (FIG. 8) as being formed of a $Zn_x(Li_yMg_z)O$ material, it must be understood that the present invention is not limited to this material, and undoped zinc oxide or other forms of doped zinc oxides may be also used. Further, any combination of zinc oxide with doped zinc oxides, as well as any combination of doped zinc oxides may be used also to form the weak ferroelectric material, as long as the spontaneous polarization of the weak ferroelectric material remains of about 0.01 $\mu$Coulomb/cm$^2$ to 1 $\mu$Coulomb/cm$^2$, For example, the weak ferroelectric layer 118 may be formed of zinc oxide (ZnO) doped only with lithium (Li) at a level from about 1 mol% up to about 30 mol% of the metal component. The doped zinc oxide material in this case has a general formula of $Zn_xLi_{1-x}O$, where x ranges from about 0.70 to about 0.99. For the above general formula, it is not necessary that the oxide materials contain stoichiometric levels of oxygen, that is one atom of oxygen for each atom of metal.

In another example, the weak ferroelectric layer 118 may be formed of zinc oxide (ZnO) doped only with magnesium at a level from about 1 mol% up to about 30 mol% of the metal component. The doped zinc oxide material in this case has a general formula of $Zn_xMg_{1-x}O$, where x ranges from about 0.70 to about 0.99. Again, for the above general formula, it is not necessary that the oxide materials contain stoichiometric levels of oxygen.

Regardless of the doping composition, the thickness of the ferroelectric material layer 118 (FIG. 8) must be greater than the thickness of the gate insulating layer 114. Thus, the thickness of the ferroelectric material layer 118 is preferably of about 500 to 5,000 Angstroms, more preferably of about 3,500 to 5,000 Angstroms. This is because a thicker layer of weak ferroelectric results in a larger voltage drop across the ferroelectric, and, consequently, a voltage difference more compatible with deep sub-micron CMOS technology. In the case of ZnO doped with lithium, for example, a $Zn_xLi_{1-x}O$ ferroelectric layer 118 of about 5,000 Angstroms gives a coercive voltage for programming of about 0.2 volts, while the normal operating voltage during the read operation is only of about 0.1 volts. The thickness of the ferroelectric layer 118 also allows the calculation of an effective oxide thickness (T$_{ox}$ of FIG. 7) of the combined oxide layers (the SiO$_2$ gate insulating layer 114, the ultra thin TiO$_2$ layer 117, and the $Zn_xLi_{1-x}O$ ferroelectric layer 118) in relation to the dielectric constants or relative electric permittivities of each of the above-mentioned layers.

For example, if the dielectric constant or relative permittivity of SiO$_2$ is about $\in_1=4$, of TiO$_2$ about $\in_2=30$, and that of $Zn_xLi_{1-x}O$, about $\in_3=250$, then the oxide ratio is about 4:30:250, that is about 1:8:62. Assuming that the SiO$_2$ gate insulating layer 114 is formed to a thickness of about 25 Angstroms, the ultra thin TiO$_2$ layer 117 is formed to a thickness of about 60 Angstroms, and the $Zn_xLi_{1-x}O$ ferroelectric layer 118 is formed to a thickness of about 5,000 Angstroms, then the effective oxide thickness T$_{ox}$ can be calculated as follows:

$$T_{ox}=25\text{ Å}+(60/8)\text{ Å}+(5,000/62)\text{Å}=113\text{ Å}$$

The value of the T$_{ox}$ is much larger than that for conventional CMOS transistors, which is more typically in the range of about 30 to 33 Angstroms.

Figure 9:
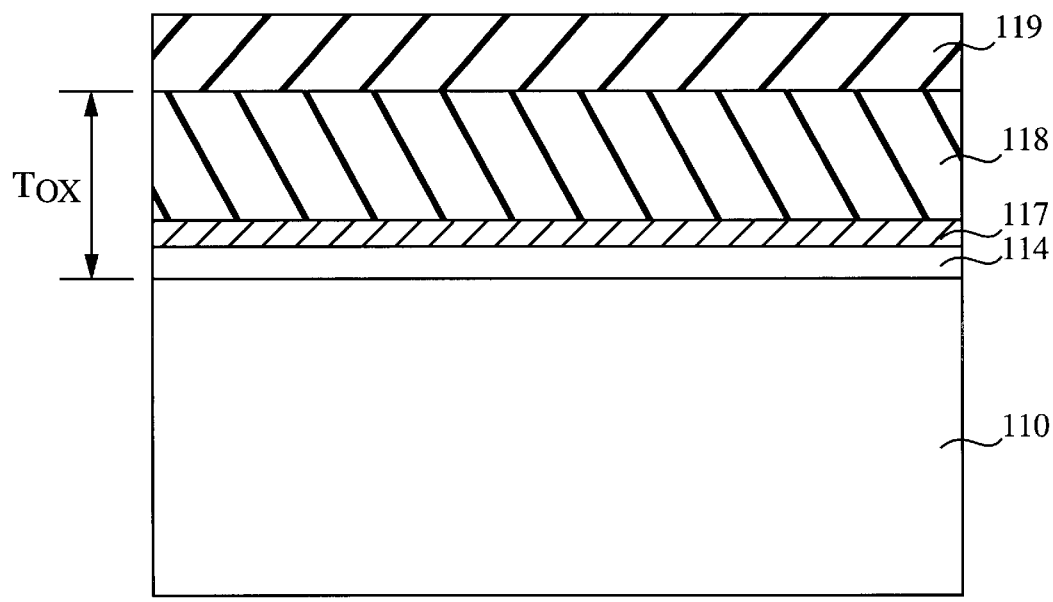
FIG. 9 is a schematic cross-sectional view of the ferroelectric memory device of FIG. 5 at a stage of processing subsequent to that shown in FIG. 8.
Figure 10:
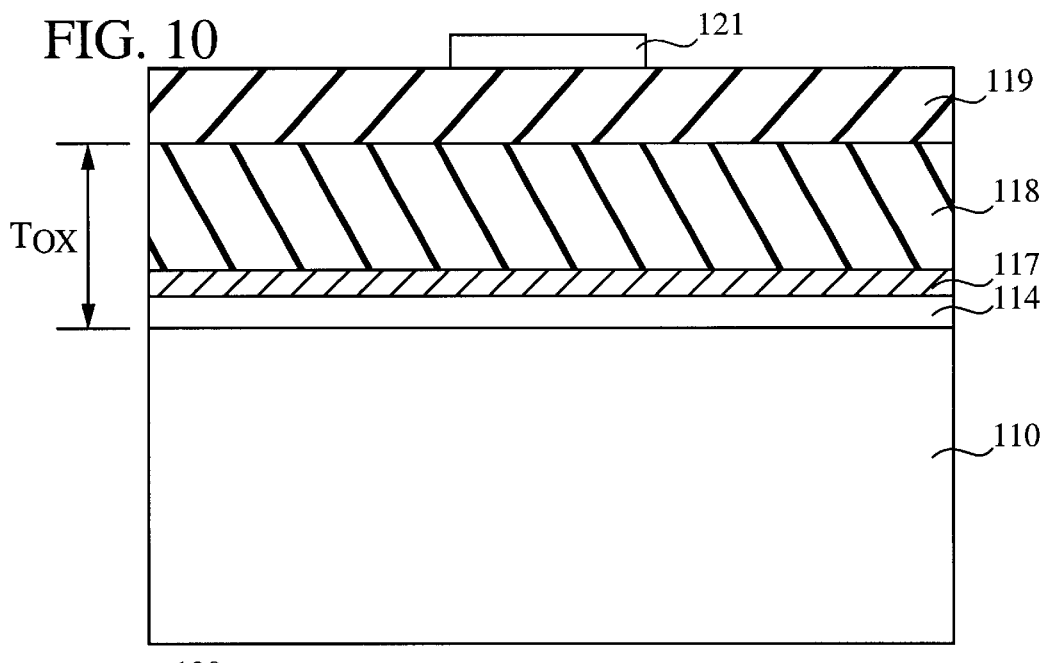
FIG. 10 is a schematic cross-sectional view of the ferroelectric memory device of FIG. 5 at a stage of processing subsequent to that shown in FIG. 9.

After the formation of the weak ferroelectric layer 118 (FIG. 8), a conductive layer 119 is formed over the weak ferroelectric layer 118, as shown in FIG. 9. The conductive layer 119 may be formed, for example, of doped polysilicon, metals, metal silicides, conductive metal oxides, or combinations of conductive materials, for example, a refractory metal silicide layer overlying a doped polysilicon layer. A protective cap layer (not shown) of silicon nitride, for example, may be optionally formed over the conductive layer 119.

Figure 11:
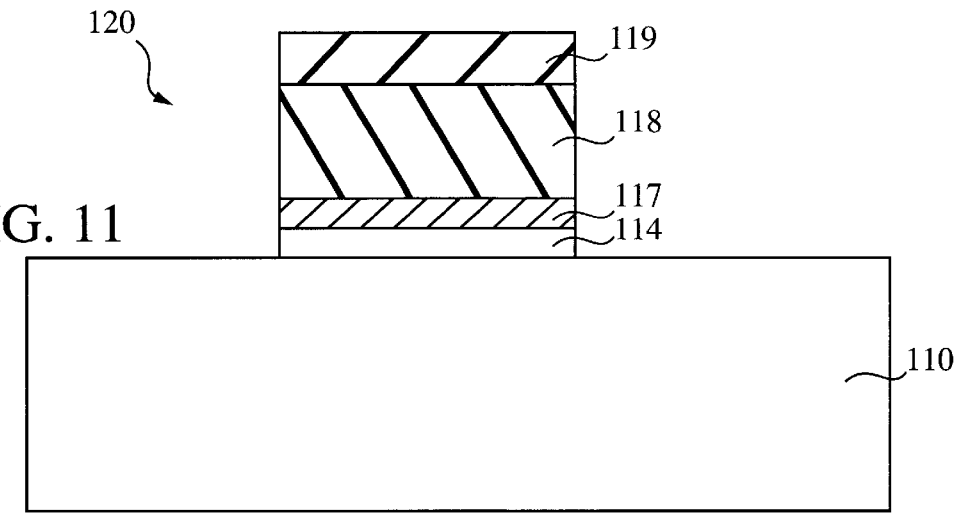
FIG. 11 is a schematic cross-sectional view of the ferroelectric memory device of FIG. 5 at a stage of processing subsequent to that shown in FIG. 10.

A photoresist layer 121 (FIG. 10) is next formed overlying the conductive layer 119 and patterned according to well-known methods of the art to form gate stack areas. After etching and removal of the photoresist layer 121, a gate stack structure 120 is defined on the silicon substrate 110, as illustrated in FIG. 11. The gate stack structure 120 includes portions of the gate insulating layer 114, the ultra thin TiO$_2$ layer 117, the weak ferroelectric layer 118, and the conductive layer 119.

Figure 12:
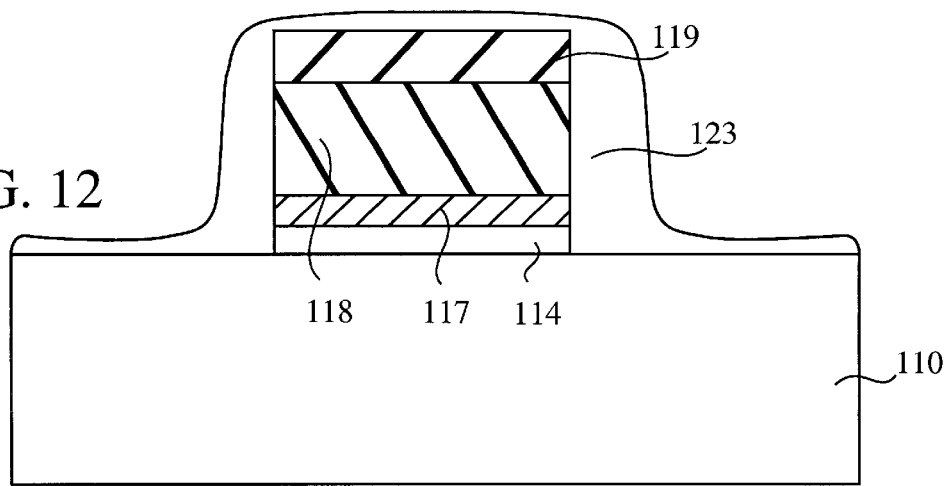
FIG. 12 is a schematic cross-sectional view of the ferroelectric memory device of FIG. 5 at a stage of processing subsequent to that shown in FIG. 11.
Figure 13:
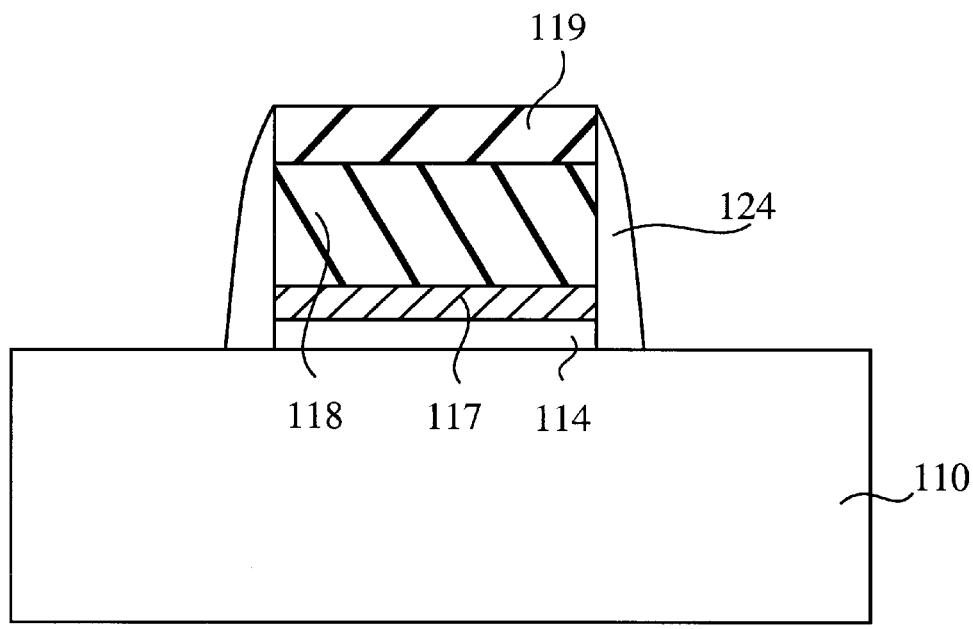
FIG. 13 is a schematic cross-sectional view of the ferroelectric memory device of FIG. 5 at a stage of processing subsequent to that shown in FIG. 12.
Figure 14:
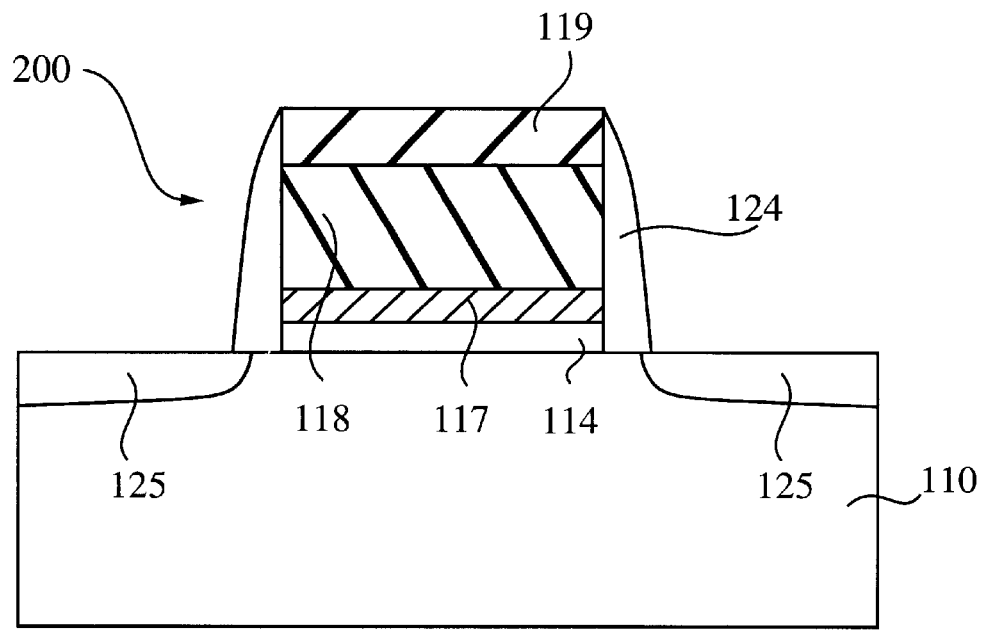
FIG. 14 is a schematic cross-sectional view of the ferroelectric memory device of FIG. 5 at a stage of processing subsequent to that shown in FIG. 13.

A spacer layer 123 is next formed over the resulting gate stack structure 120, as illustrated in FIG. 12. The spacer layer 123 may be formed of any suitable insulating material, such as, silicon oxide, silicon nitride, or silicon oxynitride. Portions of the spacer layer 123 are eventually removed anisotropically to form spacers 124, as shown in FIG. 13.

After formation of the spacers 124, source and drain regions 125 (FIG. 14) of n-type conductivity are formed in the p-type silicon substrate 110, by doping with p-type impurity ions, such as zinc (Zn), magnesium (Mg), or beryllium (Be). Thus, an n-p-n ferroelectric memory transistor 200 (FIG. 14) is formed of the gate structure 120 and the n-type source/drain regions 125 within the p-type silicon substrate 110. The ferroelectric memory transistor 200 (FIG. 14) has an ultra thin gate insulator with a high-dielectric constant (the $TiO_2$ layer 117) formed adjacent to a thick layer of ferroelectric insulating film (the weak ferroelectric layer 118), both the gate insulator and the ferroelectric insulating film having electric permittivities closer in value that those of insulating layers of conventional memory transistors. This reduced difference in the electric permittivities further confers an insignificant voltage drop across the ferroelectric material, which, in turn, permits more effective transistor operations.

The ferroelectric memory transistor 200 described above may be used further in higher IC devices, for example, for access decode and sense amplifier circuits of nonvolatile memories, such as nonvolatile random access memory. To this end, further well-known processing steps to create a functional memory cell containing the ferroelectric memory transistor 200 (FIG. 14) may now be carried out.

Figure 15:
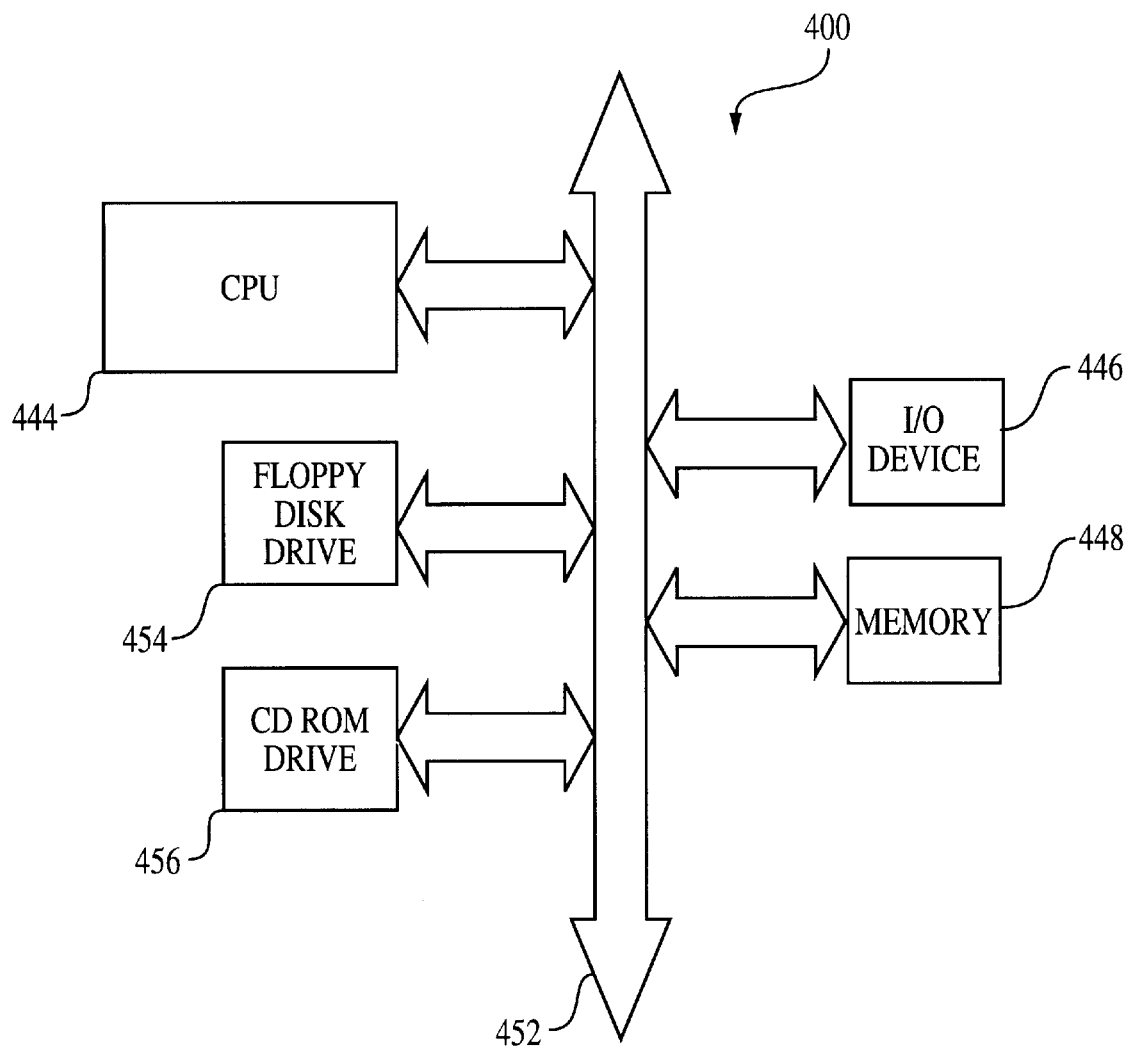
FIG. 15 is an illustration of a computer system having a memory cell with a ferroelectric memory device according to the present invention.

A typical processor based system 400, which includes a nonvolatile memory circuit 448, for example a FLASH memory, containing a ferroelectric memory transistor according to the present invention is illustrated in FIG. 15. A processor system, such as a computer system, generally comprises a central processing unit (CPU) 444, such as a microprocessor, a digital signal processor, or other programmable digital logic devices, which communicates with an input/output (I/O) device 446 over a bus 452. The memory 448 communicates with the system over bus 452.

In the case of a computer system, the processor system may include peripheral devices such as a floppy disk drive 454 and a compact disk (CD) ROM drive 456 which also communicate with CPU 444 over the bus 452. Memory 448 is preferably constructed as an integrated circuit, which includes the ferroelectric memory transistor 200 formed as previously described with respect to FIGS. 5–14. The memory 448 may be combined with the processor, e.g. CPU 444, in a single integrated circuit.

Although the invention has been illustrated for an n-p-n type ferroelectric memory transistor 200, such as the n-p-n ferroelectric memory transistor 200 (FIG. 14), fabricated on a p-type substrate, the invention could also be fabricated on an n-type substrate, as well-known in the art. This, of course, will change the doping and conductivity of the operative layers in the fabricated device.

The above description illustrates exemplary embodiments that achieve the features and advantages of the present invention. It is not intended that the present invention be limited to the illustrated embodiments. Modifications and substitutions to specific process conditions and structures can be made without departing from the spirit and scope of the present invention. Accordingly, the invention is not to be considered as being limited by the foregoing description and drawings, but is only limited by the scope of the appended claims.

What is claimed as new and desired to be protected by Letters Patent of the United States is:

1. A ferroelectric memory transistor comprising:

source and drain regions provided in a substrate; and a gate structure on said substrate between said source and drain regions, said gate structure comprising a high-dielectric constant insulating layer overlying said substrate, a weak ferroelectric material layer overlying said high-dielectric constant insulating layer, and a conductive layer overlying said weak ferroelectric material layer.

2. The transistor of claim 1, wherein said high-dielectric constant insulating layer is formed of a material selected from the group consisting of titanium oxide, barium oxide, tantalum oxide, ytterbium oxide, ruthenium oxide and cerium oxide.

3. The transistor of claim 1, wherein said high-dielectric constant insulating layer has a dielectric constant in the range of about 10 to 100.

4. The transistor of claim 3, wherein said high-dielectric constant insulating layer has a dielectric constant of about 80.

5. The transistor of claim 1, wherein said weak ferroelectric material is selected from the group consisting of zinc oxide and doped zinc oxides.

6. The transistor of claim 1 further comprising a gate insulating layer formed between said substrate and said high-dielectric constant insulating layer.

7. The transistor of claim 6, wherein said gate insulating layer is formed of a material selected from the group consisting of silicon oxides, silicon nitrides, silicon oxynitrides, and carbides.

8. The transistor of claim 1, wherein said conductive layer is formed of a material selected from the group consisting of metals, metal silicides, polysilicon, and metal oxides.

9. A ferroelectric memory transistor comprising:

source and drain regions provided in a substrate; and a gate structure on said substrate between said source and drain regions, said gate structure comprising a titanium oxide layer overlying said substrate, a ferroelectric layer overlying said titanium oxide layer, and a conductive layer overlying said ferroelectric layer.

10. A ferroelectric memory transistor comprising:

source and drain regions provided in a substrate; and a gate structure on said substrate between said source and drain regions, said gate structure comprising a barium oxide layer overlying said substrate, a ferroelectric layer overlying said barium oxide layer, and a conductive layer overlying said ferroelectric layer.

11. A ferroelectric memory transistor comprising:

source and drain regions provided in a substrate; and a gate structure on said substrate between said source and drain regions, said gate structure comprising a high-dielectric constant insulating layer having a thickness in the range of about 30 to 100 Angstroms overlying said substrate, a ferroelectric layer overlying said high-dielectric constant insulating layer, and a conductive layer overlying said ferroelectric layer.

12. The transistor of claim 11, wherein said high-dielectric constant insulating layer has a thickness of about 60 Angstroms.

13. A ferroelectric memory transistor comprising:

source and drain regions provided in a substrate; and a gate structure on said substrate between said source and drain regions, said gate structure comprising a high-dielectric constant insulating layer overlying said substrate, a weak ferroelectric layer overlying said high-dielectric constant insulating layer, and a conductive layer overlying said weak ferroelectric layer, wherein said weak ferroelectric layer is formed of a material selected from the group consisting of zinc oxide doped with lithium, zinc oxide doped with magnesium, and zinc oxide doped with lithium and magnesium.

14. The transistor of claim 13, wherein said weak ferroelectric material is $Zn_x(Li_yMg_z)O$, where x ranges from about 0.70 to about 0.99, y and z each independently range from about 0.01 to about 0.30, and the sum of (y+z) ranges from about 0.01 to about 0.30.

15. The ferroelectric memory transistor of claim 13, wherein said weak ferroelectric material is $Zn_xLi_{1-x}O$, where x ranges from about 0.70 to about 0.99.

16. The transistor of claim 13, wherein said weak ferroelectric material is $Zn_xMg_{1-x}O$, where x ranges from about 0.70 to about 0.99.

17. A ferroelectric memory transistor comprising:
source and drain regions provided in a substrate; and
a gate structure on said substrate between said source and drain regions, said gate structure comprising a high-dielectric constant insulating layer overlying said substrate, a weak ferroelectric material layer overlying said high-dielectric constant insulating layer, and a conductive layer overlying said weak ferroelectric material layer, wherein said weak ferroelectric material has a spontaneous polarization of about 0.01 $\mu Coulomb/cm^2$ to 1 $\mu Coulomb/cm^2$.

18. A ferroelectric memory transistor comprising:
source and drain regions provided in a substrate; and
a gate structure on said substrate between said source and drain regions, said gate structure comprising a high-dielectric constant insulating layer overlying said substrate, a weak ferroelectric layer having a thickness in the range of about 500 to 5,000 Angstroms overlying said high-dielectric constant insulating layer, and a conductive layer overlying said ferroelectric layer.

19. The transistor of claim 18, wherein said weak ferroelectric material has a thickness in the range of about 3,500 to 5,000 Angstroms.

20. A ferroelectric memory transistor comprising:
source and drain regions provided in a substrate; and
a gate structure on said substrate between said source and drain regions, said gate structure comprising a gate insulating layer having a thickness of about 25 Angstroms, a high-dielectric constant insulating layer overlying said gate insulating layer, a weak ferroelectric layer overlying said high-dielectric constant insulating layer, and a conductive layer overlying said ferroelectric layer.

21. A method of forming a ferroelectric memory transistor comprising the steps of:
forming a gate stack containing a gate insulating layer over a substrate, a high-dielectric constant insulating layer over said gate insulating layer, a weak ferroelectric material layer over said high-dielectric constant insulating layer, and a conductive layer over said weak ferroelectric material layer; and
forming drain and source regions on opposite sides of said gate stack.

22. The method of claim 21, wherein said high-dielectric constant insulating layer is formed of a material selected from the group consisting of titanium oxide, barium oxide, tantalum oxide, ytterbium oxide, ruthenium oxide and cerium oxide.

23. The method of claim 21, wherein said high-dielectric constant insulating layer is formed of titanium oxide.

24. The method of claim 21, wherein said high-dielectric constant insulating layer is formed of barium oxide.

25. The method of claim 21, wherein said high-dielectric constant insulating layer is formed to a thickness in the range of about 30 to 100 Angstroms.

26. The method of claim 21, wherein said high-dielectric constant insulating layer is formed to a thickness of about 60 Angstroms.

27. The method of claim 21, wherein said high-dielectric constant insulating layer is formed by jet vapor deposition.

28. The method of claim 21, wherein said weak ferroelectric material is selected from the group consisting of zinc oxide, zinc oxide doped with lithium, zinc oxide doped with magnesium, and zinc oxide doped with lithium and magnesium.

29. The method of claim 21, wherein said weak ferroelectric material is $Zn_x(Li_yMg_z)O$, where x ranges from about 0.70 to about 0.99, y and z each independently range from about 0.01 to about 0.30, and the sum of (y+z) ranges from about 0.01 to about 0.30.

30. The method of claim 21, wherein said weak ferroelectric material is $Zn_xLi_{1-x}O$, where x ranges from about 0.70 to about 0.99.

31. The method of claim 21, wherein said weak ferroelectric material is $Zn_xMg_{1-x}O$, where x ranges from about 0.70 to about 0.99.

32. The method of claim 21, wherein said weak ferroelectric material has a spontaneous polarization of about 0.01 $\mu Coulomb/cm^2$ to 1 $\mu Coulomb/cm^2$.

33. The method of claim 21, wherein said weak ferroelectric material is formed to a thickness in the range of about 500 to 5,000 Angstroms.

34. A method of forming a ferroelectric memory transistor comprising the steps of:
forming a gate stack containing a gate insulating layer over a substrate, a high-dielectric constant insulating layer over said gate insulating layer, a ferroelectric layer over said high-dielectric constant insulating layer, and a conductive layer over said ferroelectric layer, wherein said high-dielectric constant insulating layer is formed by titanium nitrite deposition followed by oxidation; and
forming drain and source regions on opposite sides of said gate stack.

35. A memory cell comprising:
a substrate;
a transistor including a gate stack fabricated on said substrate, said gate stack including a high-dielectric constant insulating layer overlying said substrate, a weak ferroelectric material layer overlying said high-dielectric constant insulating layer, and a conductive layer overlying said weak ferroelectric material layer; and
source and drain regions formed in said substrate disposed adjacent to said gate stack.

36. The memory cell of claim 35, wherein said high-dielectric constant insulating layer is formed of a material selected from the group consisting of titanium oxide, barium oxide, tantalum oxide, ytterbium oxide, ruthenium oxide and cerium oxide.

37. The memory cell of claim 35, wherein said high-dielectric constant insulating layer is formed of titanium oxide.

38. The memory cell of claim 35, wherein said high-dielectric constant insulating layer has a dielectric constant in the range of about 10 to 100.

39. The memory cell of claim 35, wherein said high-dielectric constant insulating layer has a dielectric constant of about 80.

40. A memory cell comprising:
a substrate;
a transistor including a gate stack fabricated on said substrate, said gate stack including a high-dielectric constant insulating layer having a thickness in the range of about 30 to 100 Angstroms overlying said substrate, a ferroelectric layer overlying said high-dielectric constant insulating layer, and a conductive layer overlying said ferroelectric layer; and
source and drain regions formed in said substrate disposed adjacent to said gate stack.

41. The memory cell of claim 40, wherein said high-dielectric constant insulating layer has a thickness of about 60 Angstroms.

42. A memory cell comprising:
a substrate;
a transistor including a gate stack fabricated on said substrate, said gate stack including a high-dielectric constant insulating layer overlying said substrate, a weak ferroelectric material layer overlying said high-dielectric constant insulating layer, said weak ferroelectric material being selected from the group consisting of zinc oxide, zinc oxide doped with lithium, zinc oxide doped with magnesium, and zinc oxide doped with lithium and magnesium, and a conductive layer overlying said weak ferroelectric material layer; and
source and drain regions formed in said substrate disposed adjacent to said gate stack.

43. The memory cell of claim 42, wherein said weak ferroelectric material is $Zn_x(Li_yMg_z)O$, where x ranges from about 0.70 to about 0.99, y and z each independently range from about 0.01 to about 0.30, and the sum of (y+z) ranges from about 0.01 to about 0.30.

44. The memory cell of claim 42, wherein said weak ferroelectric material is $Zn_xLi_{1-x}O$, where x ranges from about 0.70 to about 0.99.

45. The memory cell of claim 42, wherein said weak ferroelectric material is $Zn_xMg_{1-x}O$, where x ranges from about 0.70 to about 0.99.

46. The memory cell of claim 42, wherein said weak ferroelectric material has a spontaneous polarization of about 0.01 $\mu Coulomb/cm^2$ to 1 $\mu Coulomb/cm^2$.

47. The memory cell of claim 42, wherein said weak ferroelectric material has a thickness in the range of about 500 to 5,000 Angstroms.

48. The memory cell of claim 42, wherein said weak ferroelectric material has a thickness in the range of about 3,500 to 5,000 Angstroms.

49. A processor-based system comprising:
a processor; and
an integrated circuit coupled to said processor, at least one of said integrated circuit and processor comprising a ferroelectric memory transistor, said ferroelectric memory transistor comprising a gate stack structure overlying a semiconductor substrate, said gate stack structure including a high-dielectric constant insulating layer overlying said semiconductor substrate, a ferroelectric layer overlying said high-dielectric constant insulating layer, said ferroelectric layer being formed of a weak ferroelectric material, and a conductive layer overlying said ferroelectric layer.

50. The processor-based system of claim 48, wherein said high-dielectric constant insulating layer is formed of a material selected from the group consisting of titanium oxide, barium oxide, tantalum oxide, ytterbium oxide, ruthenium oxide and cerium oxide.

51. The processor-based system of claim 48, wherein said high-dielectric constant insulating layer has a thickness in the range of about 30 to 100 Angstroms.

52. The processor-based system of claim 51, wherein said high-dielectric constant insulating layer has a thickness of about 60 Angstroms.

53. The processor-based system of claim 48, wherein said high-dielectric constant insulating layer has a dielectric constant in the range of about 10 to 100.

54. The processor-based system of claim 49, wherein said high-dielectric constant insulating layer has a dielectric constant of about 80.

55. The processor-based system of claim 49, wherein said weak ferroelectric material is selected from the group consisting of zinc oxide, zinc oxide doped with lithium, zinc oxide doped with magnesium, and zinc oxide doped with lithium and magnesium.

56. The processor-based system of claim 49 further comprising a gate insulating layer formed between said semiconductor substrate and said high-dielectric constant insulating layer.

57. The processor-based system of claim 56, wherein said gate insulating layer is formed of a material selected from the group consisting of silicon oxides, silicon nitrides, silicon oxynitrides, and carbides.

58. A processor-based system comprising:
a processor; and
an integrated circuit coupled to said processor, at least one of said integrated circuit and processor comprising a ferroelectric memory transistor, said ferroelectric memory transistor comprising a gate stack structure overlying a semiconductor substrate, said gate stack structure including a titanium oxide layer overlying said semiconductor substrate, a weak ferroelectric material layer overlying said titanium oxide layer, and a conductive layer overlying said ferroelectric layer.

59. A processor-based system comprising:
a processor; and
an integrated circuit coupled to said processor, at least one of said integrated circuit and processor comprising a ferroelectric memory transistor, said ferroelectric memory transistor comprising a gate stack structure overlying a semiconductor substrate, said gate stack structure including a barium oxide layer overlying said semiconductor substrate, a weak ferroelectric material layer overlying said barium oxide layer, and a conductive layer overlying said ferroelectric layer.

60. A processor-based system comprising:
a processor; and
an integrated circuit coupled to said processor, at least one of said integrated circuit and processor comprising a ferroelectric memory transistor, said ferroelectric memory transistor comprising a gate stack structure overlying a semiconductor substrate, said gate stack structure including a high-dielectric constant insulating layer overlying said semiconductor substrate, a weak ferroelectric material layer overlying said high-dielectric constant insulating layer, and a conductive layer overlying said ferroelectric layer, and wherein said weak ferroelectric material is $Zn_x(Li_yMg_z)O$, where x ranges from about 0.70 to about 0.99, y and z each independently range from about 0.01 to about 0.30, and the sum of (y+z) ranges from about 0.01 to about 0.30.

61. A processor-based system comprising:

a processor; and an integrated circuit coupled to said processor, at least one of said integrated circuit and processor comprising a ferroelectric memory transistor, said ferroelectric memory transistor comprising a gate stack structure overlying a semiconductor substrate, said gate stack structure including a high-dielectric constant insulating layer overlying said semiconductor substrate, a weak ferroelectric material layer overlying said high-dielectric constant insulating layer, and a conductive layer overlying said ferroelectric layer, and wherein said weak ferroelectric material is $Zn_xLi_{1-x}O$, where x ranges from about 0.70 to about 0.99.

62. A processor-based system comprising:

a processor; and an integrated circuit coupled to said processor, at least one of said integrated circuit and processor comprising a ferroelectric memory transistor, said ferroelectric memory transistor comprising a gate stack structure overlying a semiconductor substrate, said gate stack structure including a high-dielectric constant insulating layer overlying said semiconductor substrate, a weak ferroelectric material layer overlying said high-dielectric constant insulating layer, and a conductive layer overlying said ferroelectric layer, and wherein said weak ferroelectric material is $Zn_xMg_{1-x}O$, where x ranges from about 0.70 to about 0.99.

63. A processor-based system comprising:

a processor; and an integrated circuit coupled to said processor, at least one of said integrated circuit and processor comprising a ferroelectric memory transistor, said ferroelectric memory transistor comprising a gate stack structure overlying a semiconductor substrate, said gate stack structure including a high-dielectric constant insulating layer overlying said semiconductor substrate, a weak ferroelectric material layer overlying said high-dielectric constant insulating layer, and a conductive layer overlying said ferroelectric layer, and wherein said weak ferroelectric material has a spontaneous polarization of about 0.01 $\mu$Coulomb/cm$^2$ to 1 $\mu$Coulomb/cm$^2$.

64. A processor-based system comprising:

a processor; and an integrated circuit coupled to said processor, at least one of said integrated circuit and processor comprising a ferroelectric memory transistor, said ferroelectric memory transistor comprising a gate stack structure overlying a semiconductor substrate, said gate stack structure including a high-dielectric constant insulating layer overlying said semiconductor substrate, a weak ferroelectric material layer overlying said high-dielectric constant insulating layer, and a conductive layer overlying said ferroelectric layer, and wherein said weak ferroelectric material has a thickness in the range of about 500 to 5,000 Angstroms.

65. The processor-based system of claim 64, wherein said weak ferroelectric material has a thickness in the range of about 3,500 to 5,000 Angstroms.

66. A processor-based system comprising:

a processor; and an integrated circuit coupled to said processor, at least one of said integrated circuit and processor comprising a ferroelectric memory transistor, said ferroelectric memory transistor comprising a gate stack structure overlying a semiconductor substrate, said gate stack structure including a high-dielectric constant insulating layer overlying said semiconductor substrate, a weak ferroelectric material layer overlying said high-dielectric constant insulating layer, and a conductive layer overlying said ferroelectric layer, and wherein said gate insulating layer has a thickness of about 25 Angstroms.

* * * * *

UNITED STATES PATENT AND TRADEMARK OFFICE
CERTIFICATE OF CORRECTION

PATENT NO. : 6,420,742 B1  
DATED : July 16, 2002  
INVENTOR(S) : Leonard Forbes et al.

Page 1 of 1

It is certified that error appears in the above-identified patent and that said Letters Patent is hereby corrected as shown below:

Column 13,  
Line 66, reads "claim 48"; should read -- claim 49 --.

Column 14,  
Line 4, reads "claim 48"; should read -- claim 49 --.  
Line 10, reads "claim 48"; should read -- claim 49 --.

Signed and Sealed this

Twenty-sixth Day of November, 2002

Attest:

JAMES E. ROGAN  
Attesting Officer  Director of the United States Patent and Trademark Office